(12) United States Patent
Chakraborty

(10) Patent No.: US 11,114,594 B2
(45) Date of Patent: Sep. 7, 2021

(54) LIGHT EMITTING DEVICE PACKAGES USING LIGHT SCATTERING PARTICLES OF DIFFERENT SIZE

(75) Inventor: Arpan Chakraborty, Goleta, CA (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 11/895,573

(22) Filed: Aug. 24, 2007

(65) Prior Publication Data

US 2009/0050911 A1 Feb. 26, 2009

(51) Int. Cl.
*H01L 33/56* (2010.01)
*H01L 33/50* (2010.01)
*H01L 33/58* (2010.01)
*H01L 25/075* (2006.01)
*H01L 33/54* (2010.01)

(52) U.S. Cl.
CPC .......... *H01L 33/56* (2013.01); *H01L 25/0753* (2013.01); *H01L 33/504* (2013.01); *H01L 33/54* (2013.01); *H01L 33/58* (2013.01); *H01L 2924/0002* (2013.01); *H01L 2933/0091* (2013.01); *Y10T 428/2991* (2015.01)

(58) Field of Classification Search
CPC ..... H01L 33/50; H01L 33/501; H01L 33/508; H01L 33/52; H01L 33/56; H01L 33/58; H01L 33/48; H01L 33/483; H01L 33/486; H01L 25/0753; H01L 33/54; H01L 33/504; Y10T 428/2991
USPC ..... 257/98, 100, E33.06, E33.061, E33.074; 313/502, 503, 512
See application file for complete search history.

(56) References Cited

U.S. PATENT DOCUMENTS

| | | | |
|---|---|---|---|
| 4,346,275 A | 8/1982 | Iwakiri et al. | 200/314 |
| 4,476,620 A | 10/1984 | Ohki et al. | 438/33 |
| 4,675,575 A | 6/1987 | Smith et al. | 315/165 |
| 4,865,685 A | 9/1989 | Palmour | 156/643 |
| 4,902,356 A | 2/1990 | Noguchi et al. | 148/33.4 |

(Continued)

FOREIGN PATENT DOCUMENTS

| | | |
|---|---|---|
| BE | 20090254 | 7/2011 |
| CN | 1698202 | 11/2005 |

(Continued)

OTHER PUBLICATIONS

PCT International Search Report and Written Opinion from related PCT application No. PCT/US2008/010703, dated Aug. 26, 2009.

(Continued)

*Primary Examiner* — Sue A Purvis
*Assistant Examiner* — Scott Stowe
(74) *Attorney, Agent, or Firm* — Withrow & Terranova, PLLC (57) ABSTRACT

A radiation emitting device comprising light scattering particles of different sizes that at least partially surround an emitter, improving the spatial color mixing and color uniformity of the device. Multiple sizes of light scattering particles are dispersed in a medium to at least partially surround a single- or multiple-chip polychromatic emitter package. The different sizes of light scattering particles interact with corresponding wavelength ranges of emitted radiation. Thus, radiation emitted over multiple wavelength ranges or sub-ranges can be efficiently scattered to eliminate (or intentionally create) spatially non-uniform color patterns in the output beam.

29 Claims, 5 Drawing Sheets

(56) References Cited

U.S. PATENT DOCUMENTS

| | | | |
|---|---|---|---|
| 4,912,532 A | 3/1990 | Cook et al. | 357/16 |
| 4,946,547 A | 8/1990 | Palmour et al. | 156/643 |
| 4,981,551 A | 1/1991 | Palmour | 156/643 |
| 5,087,949 A | 2/1992 | Haitz | 357/17 |
| 5,103,271 A | 4/1992 | Izumiya et al. | 357/17 |
| 5,200,022 A | 4/1993 | Kong et al. | 156/612 |
| 5,376,241 A | 12/1994 | Shor et al. | 204/129.3 |
| 5,376,580 A | 12/1994 | Kish et al. | 437/127 |
| RE34,861 E | 2/1995 | Davis et al. | 437/100 |
| 5,453,405 A | 9/1995 | Fan et al. | 438/34 |
| 5,502,316 A | 3/1996 | Kish et al. | 257/94 |
| 5,614,734 A | 3/1997 | Guido | 257/94 |
| 5,644,156 A | 7/1997 | Suzuki et al. | 257/485 |
| 5,803,579 A | 9/1998 | Turnbull et al. | |
| 5,939,732 A | 8/1999 | Kurtz et al. | 257/77 |
| 5,958,687 A | 9/1999 | Dehoux et al. | 438/46 |
| 5,959,316 A | 9/1999 | Lowery | 257/98 |
| 6,071,795 A | 6/2000 | Cheung et al. | 438/458 |
| 6,132,072 A | 10/2000 | Turnbull et al. | |
| 6,160,834 A | 12/2000 | Scott | 372/96 |
| 6,212,213 B1 | 4/2001 | Weber et al. | |
| 6,225,647 B1 | 5/2001 | Kurtz et al. | 257/94 |
| 6,234,648 B1 | 5/2001 | Borner et al. | |
| 6,258,699 B1 | 7/2001 | Chang et al. | 438/458 |
| 6,274,924 B1 | 8/2001 | Carey et al. | 257/676 |
| 6,303,405 B1 | 10/2001 | Yoshida et al. | 438/46 |
| 6,350,041 B1 | 2/2002 | Tarsa et al. | 362/231 |
| 6,365,429 B1 | 4/2002 | Kneissl et al. | 438/46 |
| 6,375,340 B1 | 4/2002 | Biebl | |
| 6,395,572 B1 | 5/2002 | Tsutsui et al. | 438/46 |
| 6,410,942 B1 | 6/2002 | Thibeault et al. | 257/88 |
| 6,420,199 B1 | 7/2002 | Coman et al. | 438/22 |
| 6,420,242 B1 | 7/2002 | Cheung et al. | 438/458 |
| 6,429,460 B1 | 8/2002 | Chen et al. | 257/79 |
| 6,448,102 B1 | 9/2002 | Kneissl et al. | 438/46 |
| 6,455,340 B1 | 9/2002 | Chua et al. | 438/31 |
| 6,465,809 B1 | 10/2002 | Furukawa et al. | 257/94 |
| 6,468,824 B2 | 10/2002 | Chen et al. | 438/46 |
| 6,480,389 B1 | 11/2002 | Shie | |
| 6,486,499 B1 | 11/2002 | Krames et al. | 257/81 |
| 6,489,637 B1 | 12/2002 | Sakamoto | |
| 6,513,949 B1 | 2/2003 | Marshall et al. | |
| 6,538,371 B1 | 3/2003 | Duggal et al. | |
| 6,550,949 B1 | 4/2003 | Bauer et al. | |
| 6,552,495 B1 | 4/2003 | Chang | |
| 6,559,075 B1 | 5/2003 | Kelly et al. | 438/795 |
| 6,562,648 B1 | 5/2003 | Wong et al. | 438/46 |
| 6,577,073 B2 | 6/2003 | Shimizu et al. | 315/246 |
| 6,607,931 B2 | 8/2003 | Streubel | 438/22 |
| 6,642,652 B2 | 11/2003 | Collins et al. | 313/512 |
| 6,653,765 B1 * | 11/2003 | Levinson et al. | 313/112 |
| 6,657,236 B1 | 12/2003 | Thibeault et al. | 257/98 |
| 6,677,173 B2 | 1/2004 | Ota | 438/22 |
| 6,692,136 B2 | 2/2004 | Marshall et al. | |
| 6,716,654 B2 | 4/2004 | Hsu et al. | 438/22 |
| 6,740,604 B2 | 5/2004 | Kelly et al. | 438/795 |
| 6,741,029 B2 | 5/2004 | Matsubara | |
| 6,757,314 B2 | 6/2004 | Kneissl et al. | 372/50 |
| 6,784,463 B2 | 8/2004 | Camras et al. | |
| 6,786,390 B2 | 9/2004 | Yang et al. | 228/179.1 |
| 6,791,119 B2 | 9/2004 | Slater et al. | 257/99 |
| 6,791,259 B1 | 9/2004 | Stokes | |
| 6,797,987 B2 | 9/2004 | Chen | 257/98 |
| 6,800,500 B2 | 10/2004 | Coman et al. | 438/22 |
| 6,806,112 B1 | 10/2004 | Horng et al. | 438/29 |
| 6,809,341 B2 | 10/2004 | Hsu et al. | 257/79 |
| 6,809,347 B2 | 10/2004 | Tasch et al. | |
| 6,817,735 B2 | 11/2004 | Shimizu et al. | |
| 6,821,804 B2 | 11/2004 | Thibeault et al. | 438/29 |
| 6,828,596 B2 | 12/2004 | Steigerwald et al. | 257/99 |
| 6,841,804 B1 | 1/2005 | Chen et al. | |
| 6,841,808 B2 | 1/2005 | Shibata et al. | 257/190 |
| 6,846,686 B2 | 1/2005 | Saeki et al. | 438/22 |
| 6,849,878 B2 | 2/2005 | Bader et al. | 257/103 |
| 6,869,812 B1 | 3/2005 | Liu | |
| 6,870,311 B2 * | 3/2005 | Mueller et al. | 313/491 |
| 6,884,647 B2 | 4/2005 | Sakai et al. | 438/30 |
| 6,900,473 B2 | 5/2005 | Yoshitake et al. | 257/95 |
| 6,914,267 B2 | 7/2005 | Fukasawa et al. | |
| 6,936,857 B2 | 8/2005 | Doxsee et al. | |
| 6,946,309 B2 | 9/2005 | Camras et al. | 438/26 |
| 6,953,255 B2 | 10/2005 | Horiuchi | |
| 6,972,438 B2 | 12/2005 | Li et al. | 257/98 |
| 7,005,679 B2 * | 2/2006 | Tarsa et al. | 257/89 |
| 7,008,078 B2 | 3/2006 | Shimizu et al. | |
| 7,009,215 B2 | 3/2006 | D'Evelyn et al. | 257/98 |
| 7,014,336 B1 | 3/2006 | Ducharme et al. | |
| 7,061,454 B2 | 6/2006 | Sasuga et al. | |
| 7,066,623 B2 | 6/2006 | Lee et al. | |
| 7,084,557 B2 | 8/2006 | Mishima | 313/25 |
| 7,095,056 B2 | 8/2006 | Vitta et al. | |
| 7,102,152 B2 | 9/2006 | Chua et al. | |
| 7,154,125 B2 | 12/2006 | Koide et al. | 257/95 |
| 7,213,940 B1 | 5/2007 | Van De Ven et al. | |
| 7,256,480 B2 | 8/2007 | Hung et al. | 257/666 |
| 7,348,212 B2 | 3/2008 | Schiaffino et al. | 438/106 |
| 7,391,046 B2 | 6/2008 | Tsutsumi et al. | 257/13 |
| 7,514,867 B2 | 4/2009 | Yano et al. | 313/512 |
| 7,709,282 B2 | 5/2010 | Fukshima et al. | 438/26 |
| 7,868,341 B2 | 1/2011 | Diana et al. | 257/98 |
| 2002/0080615 A1 | 6/2002 | Marshall et al. | 362/333 |
| 2002/0139990 A1 | 10/2002 | Suehiro et al. | |
| 2002/0153835 A1 | 10/2002 | Fujiwara et al. | |
| 2002/0163302 A1 | 11/2002 | Nitta et al. | |
| 2002/0180351 A1 | 12/2002 | McNulty | |
| 2002/0187571 A1 | 12/2002 | Collins et al. | 438/29 |
| 2003/0030063 A1 | 2/2003 | Sosniak et al. | |
| 2003/0038596 A1 * | 2/2003 | Ho | 313/512 |
| 2003/0124752 A1 | 7/2003 | Wei et al. | |
| 2003/0146411 A1 | 8/2003 | Srivastava et al. | |
| 2003/0156425 A1 | 8/2003 | Turnbull et al. | |
| 2003/0173602 A1 | 9/2003 | Hsu et al. | |
| 2004/0012027 A1 | 1/2004 | Keller et al. | 257/79 |
| 2004/0033638 A1 | 2/2004 | Bader et al. | |
| 2004/0070004 A1 | 4/2004 | Eliashevich et al. | |
| 2004/0072382 A1 | 4/2004 | Kelly et al. | |
| 2004/0094757 A1 | 5/2004 | Braune et al. | |
| 2004/0094774 A1 | 5/2004 | Steigerwald et al. | |
| 2004/0105261 A1 | 6/2004 | Ducharme et al. | |
| 2004/0188697 A1 | 9/2004 | Brunner et al. | |
| 2004/0217364 A1 | 11/2004 | Tarsa et al. | 257/69 |
| 2005/0077535 A1 | 4/2005 | Li | |
| 2005/0082562 A1 | 4/2005 | Ou et al. | 257/94 |
| 2005/0082974 A1 | 4/2005 | Fukasawa et al. | |
| 2005/0117320 A1 | 6/2005 | Leu et al. | H01L 33/00 |
| 2005/0122720 A1 * | 6/2005 | Shimonaka et al. | 362/257 |
| 2005/0152127 A1 | 7/2005 | Kamiya et al. | 362/84 |
| 2005/0162845 A1 | 7/2005 | McDermott | |
| 2005/0168994 A1 | 8/2005 | Jacobson et al. | |
| 2005/0189539 A1 | 9/2005 | Furukawa et al. | |
| 2005/0224821 A1 * | 10/2005 | Sakano et al. | 257/79 |
| 2005/0224829 A1 | 10/2005 | Negley et al. | |
| 2005/0227379 A1 | 10/2005 | Donofrio | |
| 2005/0280007 A1 | 12/2005 | Hsu et al. | 257/79 |
| 2006/0012989 A1 | 1/2006 | Lee | |
| 2006/0063289 A1 | 3/2006 | Negley | |
| 2006/0081862 A1 | 4/2006 | Chua et al. | |
| 2006/0081869 A1 | 4/2006 | Lu et al. | |
| 2006/0105482 A1 | 5/2006 | Alferink et al. | |
| 2006/0189013 A1 | 8/2006 | Schardt et al. | |
| 2006/0220046 A1 * | 10/2006 | Yu | G02B 6/0016 257/98 |
| 2006/0228973 A1 | 10/2006 | Janning | |
| 2006/0244358 A1 | 11/2006 | Kim et al. | |
| 2006/0255341 A1 | 11/2006 | Pinnington et al. | |
| 2006/0258028 A1 | 11/2006 | Paolini et al. | 438/22 |
| 2006/0273335 A1 | 12/2006 | Asahara | |
| 2007/0007558 A1 | 1/2007 | Mazzochette | |
| 2007/0215890 A1 | 9/2007 | Harbers et al. | |
| 2008/0048200 A1 | 2/2008 | Mueller et al. | |
| 2008/0074032 A1 | 3/2008 | Yano et al. | 313/503 |
| 2008/0094829 A1 | 4/2008 | Narendran et al. | 362/231 |
| 2008/0210961 A1 | 9/2008 | Lin et al. | 257/98 |
| 2008/0217635 A1 | 9/2008 | Emerson | |

(56) References Cited

U.S. PATENT DOCUMENTS

| | | | |
|---|---|---|---|
| 2008/0225528 A1 | 9/2008 | Holder et al. | 362/308 |
| 2008/0278655 A1 | 11/2008 | Moon et al. | 349/58 |
| 2009/0008662 A1 | 1/2009 | Ashdown et al. | 257/98 |
| 2009/0026908 A1 | 1/2009 | Bechtel et al. | H01L 33/00 |
| 2009/0050911 A1 | 2/2009 | Chakraborty | |
| 2009/0135581 A1 | 5/2009 | Yano et al. | 362/84 |
| 2009/0173960 A1 | 7/2009 | Martin et al. | 257/98 |
| 2009/0267090 A1 | 10/2009 | Chang et al. | |
| 2010/0103678 A1 | 4/2010 | Van de Ven et al. | 362/294 |
| 2011/0215347 A1 | 9/2011 | Wong et al. | |
| 2011/0266574 A1 | 11/2011 | Liao et al. | |
| 2011/0273079 A1 | 11/2011 | Pickard et al. | 313/483 |
| 2012/0229018 A1* | 9/2012 | Lenk et al. | 313/503 |

FOREIGN PATENT DOCUMENTS

| | | |
|---|---|---|
| CN | 1698202 A | 11/2005 |
| CN | 1910762 | 2/2007 |
| CN | 1910762 A | 2/2007 |
| EP | 0684648 | 11/1995 |
| EP | 1059667 | 12/2000 |
| EP | 1156020 A1 | 11/2001 |
| EP | 1246266 | 10/2002 |
| EP | 1263058 A | 12/2002 |
| EP | 1345275 A | 9/2003 |
| EP | 1369935 A1 | 12/2003 |
| EP | 1 369 935 A1 | 12/2003 |
| EP | 1737050 A1 | 12/2006 |
| EP | 1 737 050 A1 | 12/2006 |
| GB | 2282700 A | 4/1995 |
| JP | S6092678 | 5/1985 |
| JP | 61059886 | 3/1986 |
| JP | 03206672 | 9/1991 |
| JP | H03-206672 | 9/1991 |
| JP | H03206672 | 9/1991 |
| JP | H03206673 | 9/1991 |
| JP | H04137570 | 5/1992 |
| JP | 09-153646 | 6/1997 |
| JP | 10-163535 | 6/1998 |
| JP | 11238913 | 8/1999 |
| JP | 11-307813 | 11/1999 |
| JP | 2000-353826 | 12/2000 |
| JP | 2001148515 | 5/2001 |
| JP | 2002033517 | 1/2002 |
| JP | 2002-57376 | 2/2002 |
| JP | 2002-299699 | 10/2002 |
| JP | 2002299694 | 10/2002 |
| JP | 2003031008 | 1/2003 |
| JP | 2003-124522 | 4/2003 |
| JP | 2003-515956 | 5/2003 |
| JP | 2003-529889 | 10/2003 |
| JP | 2004-031856 | 1/2004 |
| JP | 2004-080046 | 3/2004 |
| JP | 2004-103443 | 4/2004 |
| JP | 2004165541 | 6/2004 |
| JP | 2004259541 | 9/2004 |
| JP | 2004-356116 | 12/2004 |
| JP | 2004341446 | 12/2004 |
| JP | 2005-142311 | 6/2005 |
| JP | 2005183193 | 7/2005 |
| JP | 2005210042 | 8/2005 |
| JP | 2005524737 A | 8/2005 |
| JP | 2005-232305 | 9/2005 |
| JP | 2006114900 | 4/2006 |
| JP | 2006229109 A | 8/2006 |
| JP | 2006269778 | 10/2006 |
| JP | 2006-313902 | 11/2006 |
| JP | 2006313902 | 11/2006 |
| JP | 2007035802 | 2/2007 | H01L 33/00 |
| JP | 2007-149909 | 6/2007 |
| JP | 2007165508 A | 6/2007 |
| JP | 2007173372 A | 7/2007 |
| JP | 2007294197 | 11/2007 |
| JP | 2008060068 | 3/2008 |
| JP | 2008084990 | 4/2008 |
| JP | 2009054995 A | 3/2009 |
| KR | 2002-77135 | 10/2002 |
| TW | 200633249 | 9/2006 |
| TW | 200642011 | 12/2006 |
| WO | WO 83/00408 A1 | 2/1983 |
| WO | WO 2001/041225 A2 | 6/2001 |
| WO | WO03005458 A1 | 1/2003 |
| WO | WO03010832 | 2/2003 |
| WO | WO 2003/065464 A1 | 8/2003 |
| WO | WO2004/100279 | 11/2004 |
| WO | WO05048361 A2 | 5/2005 |
| WO | WO2005067066 | 7/2005 |
| WO | WO2005091387 | 9/2005 |
| WO | WO 2005/104247 A | 11/2005 |
| WO | WO2005104247 | 11/2005 |
| WO | WO 2005/124877 | 12/2005 |
| WO | WO06035664 A | 4/2006 |
| WO | WO 2006/048064 A1 | 5/2006 |
| WO | WO2006048064 A1 | 5/2006 |
| WO | WO2006105646 | 10/2006 |
| WO | WO 2007/063460 A1 | 6/2007 |
| WO | WO 2007/141763 A1 | 12/2007 |
| WO | WO2008156518 | 12/2008 |
| WO | WO2009156518 A1 | 12/2008 |
| WO | WO 2009/039805 A1 | 4/2009 |
| WO | WO2010070120 | 6/2010 |
| WO | WO2011020098 | 2/2011 |
| WO | WO2011118178 | 9/2011 |
| WO | WO2012047505 | 12/2012 |
| WO | WO2012047937 | 12/2012 |

OTHER PUBLICATIONS

US Publication No. US 2007/0057271 A1, to Schiaffino, et al. dated Mar. 15, 2007.
US Publication No. US 2007/0262338 A1, to Higashi et al., dated Nov. 15, 2007.
US Publication No. US 2005/0077531 A1, to Kim, dated Apr. 14, 2005.
US Publication No. US 2005/0104080 A1, to Ichihara, dated May 19, 2005.
US Publication No. US 2007/0200127 A1, to Andrews et al., dated Aug. 30, 2007.
U.S. Appl. No. 11/613,692, filed Dec. 20, 2006.
U.S. Appl. No. 11/614,180, filed Dec. 21, 2006.
U.S. Appl. No. 11/613,714, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 11/951,626, filed Dec. 6, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
U.S. Appl. No. 11/895,573, filed Aug. 24, 2007.
U.S. Appl. No. 11/835,044, filed Aug. 7, 2007.
U.S. Appl. No. 12/248,220, filed Oct. 9, 2008.
U.S. Appl. No. 12/277,745, filed Nov. 25, 2008.

(56) References Cited

OTHER PUBLICATIONS

Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Cree® XLamp® 7090 XR-E Series LED Binning and Labeling.
Related Indian Patent Application No. 4867/DELNP/2005, first examination report dated Apr. 4, 2008.
Nichia Corp. White LED, Part No. NSPW312BS. Specification for Nichia White LED, Model NSPW312BS, Jan. 14, 2004.
Nichia Corp. White LED, Part No. NSPW300BS. Specification for Nichia White LED, Model NSPW300BS, Jan. 14, 2004.
European Patent Application No. 05761972.8 Office Action dated Dec. 12, 2009.
International Search Report and Written Opinion of International Application No. PCT/US2005/020603 dated Jan. 12, 2006.
Official Notice of Rejection for Japanese Patent Application No. 2006-513442 dated Jun. 8, 2010.
First Office Action from Chinese Patent Application No. 200910137491.3 dated Apr. 14, 2010.
PCT International Preliminary Report, dated Mar. 27, 2008, PCT/US05/20603.
Windisch et al., *Impact of Texture-Enhanced Transmission on High-Efficiency Surface-Textured Light-Emitting Diodes*, Applied Physics Letters, vol. 79, No. 15, Oct. 8, 2001, pp. 2315-2317.
Schnitzer et al., *30% External Quantum Efficiency from Surface Textured, Thin-Film Light-Emitting Diodes*, Applied Physics Lett. 63(16), Oct. 18, 1993, pp. 2174-2176.
Windisch et al., *Light-Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.
Streubel et al., *High Brightness AlGaInP Light-Emitting Diodes*. IEEE Journal on Selected Topics in Quantum Electronics, vol. 8, No. 2, Mar./Apr. 2002, pp. 321-332.
Shor et al., *Direct Observation of Porous SiC Formed by Anodization in HF*, Appl. Phys. Lett. 62(22), May 31, 1993, pp. 2836-2838.
Windisch et al., *40% Efficient Thin-Film Surface-Textured Light-Emitting Diodes by Optimization of Natural Lithography*, IEEE Transactions on Electron Devices, vol. 47, No. 7, Jul. 7, 2000. pp. 1492-1498.
Khan F. A. et al, "High Rate Etching of SIC Using Inductively Coupled Plasma Reactive Ion Etching in SF6-Based Gas Mixtures", Applied Physics Letters, AIP, American Institute of Physics, Melville, NY, US, vol. 75, No. 15, Oct. 11, 1999 pp. 2268-2270.
Palmour J W et al., "Crystallographic Etching Phenomenon During Plasma Etching of SIC (100) ThinFilms in SF6", Journal of the Electrochemical Society, Electrochemical Society, Manchester, New Hampshire, U.S., vol. 136, No. 2, Feb. 1, 1989, pp. 491-495.
Kelner G. et al., "Plasma Etching of Beta-SIC", Journal of the Electrochemical Society, Electrochemical Society. Manchester, New Hampshire, U.S. vol. 134, No. 1, Jan. 1987, pp. 253-254.
American Institute PF Physics Handbook, Third Edition, McGraw-Hill, Ed: Dwight E. Gray, 1972.
Lagoubi, et al. "Conditioning of N-Silicon by Photoelectrochemical Etching for Photovoltaic Applications", Proc. of the 11th E.C. Photovoltaic Solar Energy Conference, Oct. 12, 1992-Oct. 16, 1992, pp. 250-253, XP008043956, pp. 252-253 Figure 8.
Patent Abstracts of Japan 07007179, Oct. 1995, Sanyo Electric Co Ltd, "Light Emitting Elements".
Journal of Optics A: Pure and Applied Optics 7 (2005) S3-S11, Review Article "Left-Handed Electromagnetism Obtained Via Nanostructured Metamaterials: Comparison With That From Microstructured Photonic Crystals", Mathias Perrin et al.
Journal of Modern Optics vol. 52, No. 8, May 2005, pp. 1155-1160, "Design and Fabrication of Omnidirectional Reflectors in the Visible Range", Weihua Lin et al.
Windisch et al., *Non-Resonant Cavity Light-Emitting Diodes*, In Light-Emitting Diodes: Research, Manufacturing, and Applications IV, H. Walter Yao et al., Proceedings of SPIE vol. 3938 (2000), pp. 70-76.
Zangooie et al., *Surface, Pore Morphology, and Optical Properties of Porous 4H-SiC*, Journal of the Electrochemical Society, 148(6) G297-G302 (2001) Jan. 9, 2001.
Mimura et al, *Blue Electroluminescence From Porous Silicon Carbide*, Appl. Phys. Lett 65(26), Dec. 26, 1994, pp. 3350-3352.
Kasugai et al., "Moth-Eye Light-Emitting Diodes", Mater Res. Soc. Symp. Proc. vol. 831, 2005 Materials Research Society, pp. E1.9.1-E1.9.6.
Notification of First Office Action for Chinese Patent Application No. 200880100370.5 dated Apr. 26, 2011.
International Search Report and Written Opinion for PCT Application No. PCT/US2008/004453 dated Sep. 9, 2008.
Kim, J.K., et al., "Strongly Enhanced Phosphor Efficiency in GaInN White Light-Emitting Diodes using Remote Phosphor Configuration and Diffuse Reflector Cup" Japanese Journal of Applied Physics, Japan Society of Applied Physics, Tokyo, JP vol. 44, No. 20-23, Jan. 1, 2005, pp. L649-L651.
Office Action from patent U.S. Appl. No. 11/708,990, dated May 26, 2010.
Extended European Search Report for European Patent Application No. 09159268.3 dated Aug. 22, 2011.
Notification of Second Office Action for Chinese Patent Application 200880100370.5, dated Feb. 22, 2012.
Summary of Notice of Reasons for Rejection for Japanese Patent Application No. JP 2010-512143 dated Jan. 10, 2012.
Notification of Reasons for Rejection for Japanese Patent Application No. 2009-112468 dated Oct. 18, 2011.
Final Rejection for counterpart Japanese Patent Application No. JP 2008-163311 dated Nov. 29, 2011.
Office Action from U.S. Appl. No. 12/151,089, dated Apr. 5, 2011.
Response to Office Action from U.S. Appl. No. 12/151,089, filed Jun. 24, 2011.
Office Action from U.S. Appl. No. 12/151,089, dated Nov. 3, 2011.
Decision for Grant for Japanese Patent Application No. 2010-512143, Issued Jul. 3, 2012.
Third Office Action from Chinese Patent Application No. 200880100370.5, dated Sep. 29, 2012.
Notification of Reasons for Rejection from Japanese Patent Application No. 2009-112468, dated Nov. 1, 2012.
Office Action from Japanese Patent Application No. 2012-519534, dated Apr. 12, 2013.
Reasons for Rejection from Japanese Patent Appl. No. 2012-083671, dated Aug. 26, 2013 (Received Oct. 2. 2013).
Office Action from Japanese Patent Appl. No. 2012-191540, dated Aug. 9, 2013.
Official Action from European Patent Appl. No. 08 754 071.2-1551, dated May 8, 2013.
Response to Office Action from U.S. Appl. No. 12/151,089, filed Jul. 11, 2013.
Response to Office Action from U.S. Appl. No. 13/169,866, filed Aug. 27, 2013.
Decision of Rejection from Chinese Patent Application No. 200880100370.5, dated May 2, 2013.
Decision of Rejection from Chinese Patent Appl. No. 200980129742.1, dated Jan. 6, 2014.
Office Action from Taiwanese Patent Appl. No. 098118090, dated Apr. 11, 2014.
Decision of Appeal against Japanese Patent Appl. No. 2011-511641, dated Jul. 18, 2014.
Office Action from U.S. Appl. No. 12/475,261, dated Jun. 10, 2014.
Response to OA from U.S. Appl. No. 12/475,261, filed Aug. 8, 2014.
Office Action from U.S. Appl. No. 12/151,089, dated Jul. 21, 2014.
Office Action from U.S. Appl. No. 13/169,866, dated Jul. 17, 2014.
Office Action and Search Report from Taiwanese Patent Appl. No. 097113543, dated Jun. 3, 2014.
Office Action from Japanese Patent Appl. No. 2011-511641, dated Jan. 31, 2014.

(56) References Cited

OTHER PUBLICATIONS

First Office Action and Search Report from Chinese Patent appl. No. 201080030421.9, dated Feb. 12, 2014.
Office Action from U.S. Appl. No. 12/745,261, dated Feb. 27, 2014.
Office Action from U.S. Appl. No. 13/169,866, dated Feb. 7, 2014.
Office Action from U.S. Appl. No. 12/151,089, dated Mar. 13, 2014.
Decision of Rejection from Japanese Patent Appl. No. 2012-083671, dated Mar. 11, 2014.
Examination Report from European Patent Appl. No. 09 758 707.5-1565, dated Apr. 4, 2014.
Office Action from Taiwanese Patent Appl. No. 098118090, dated Apr. 3, 2014.
Search Report from Taiwanese Patent Appl. No. 098118090, dated Apr. 3, 2014.
Re-examination Report from Japanese Patent appl. No. 2012-519534, dated Feb. 24, 2014.
Decision of Rejection from Japanese Patent Appl. No. 2012-191540, dated Mar. 19, 2014.
Notification of Reexamination from Chinese Appl. No. 200901297421, dated Jan. 13, 2015.
Decision from Taiwanese Patent Appl. No. 098118090, dated Sep. 22, 2014.
Office Action and Search Report from Taiwanese Appl. No. 097113543, dated Oct. 30, 2014.
Office Action from U.S. Appl. No. 12/151,089, dated Nov. 12, 2014.
Examiner's Report from European Patent Appl. No. 09 159 268.3-1558, dated Jan. 27, 2015.
Office Action from Taiwanese Patent Appl. No. 099122185 dated Jan. 6, 2015.
Preliminary Report from Japanese Appl. No. 2012-083671, dated Aug. 21, 2014.
Second Office Action from Chinese Patent Appl. No. 201080030421.9, dated Sep. 25, 2014.
Appeal Decision (summary) from Japanese Patent Appl. No. 2012-83671, dated Apr. 27, 2015.
Notification of Reexamination from Chinese Patent appl. No. 2009801297421, dated Apr. 3, 2015.
Notice of Allowance from Taiwanese Patent Appl. No. 10420751350, dated Jun. 10, 2015.
Office Action from Korean Patent Appl. No. 10-2010-7029502, dated Jun. 3, 2015.
Office Action from U.S. Appl. No. 12/475,261, dated Feb. 20, 2015.
Office Action from U.S. Appl. No. 12/151,089, dated Mar. 16, 2015.
Office Action from U.S. Appl. No. 13/169,866, dated Mar. 16, 2015.
Examination from European Patent Appl. No. 08 754 071.2-1551, dated Nov. 20, 2015.
Fourth Office Action from Chinese Patent Appl. No 201080030421.9, dated Nov. 17, 2015.
Office Action from U.S. Appl. No. 13/169,866, dated Nov. 5, 2015.
Foreign Office Action for European Application No. 09 159 268.3; dated Dec. 12, 2017.
International Search Report and Written Opinion for PCT application No. PCT/US2010/024980 dated Oct. 6, 2010.
Office Action for German Patent Application No. 10 2008 029 318.0 dated Dec. 13, 2010.
Extended European Search Report for European Patent Application No. 10185708.4 dated Dec. 2, 2010.
Office Action for Korean Patent Application No. 10-2005-70204263 dated Dec. 21, 2010.
Notice of Reasons for Rejection from Japanese Patent Application No. 2008-037765 dated Mar. 23, 2011.
Summary of Notice of Reasons for Rejection for Japanese Patent Application No. 2007-520314 dated May 10, 2011.
Office Action for counterpart Japanese Patent Application No. JP 2008-163311 dated Mar. 29, 2011.
Office Action for Japanese Patent Application No. JP 2006-513442 dated May 12, 2011.
International Search Report and Written Opinion for PCT Application No. PCT/US2011/000381 dated Jun. 8, 2011.
Office Action from U.S. Appl. No. 13/169,866, dated Oct. 18, 2013.
Response to OA from U.S. Appl. No. 13/169,866, filed Dec. 17, 2013.
Office Action from U.S. Appl. No. 12/151,089, dated May 22, 2013.
Response to OA from U.S. Appl. No. 12/151,089, filed Jul. 11, 2013.
Office Action from U.S. Appl. No. 12/151,089, dated Sep. 6, 2013.
Fourth Office Action from Chinese Patent Appl. No. 200880100370.5, dated Nov. 15, 2013.
Third Office Action from Chinese Patent Appl. No. 200980129742.1, dated Jun. 20, 2013.
Appeal Board's Questioning from Japanese Patent appl. No. 2011-511641, dated Jul. 8, 2013.
Decision of Rejection from Japanese Patent appl. No. 2012-519534, dated Jul. 24, 2013.
Office Action from U.S. Appl. No. 13/169,866, dated Apr. 4, 2013.
Office Action from U.S. Appl. No. 12/475,261, dated Apr. 2, 2013.
Response to OA from U.S. Appl. No. 12/475,261, filed Aug. 22, 2013.
Office Action from U.S. Appl. No. 13/169,866, dated Nov. 7, 2012.
Response to OA from U.S. Appl. No. 13/169,866, filed Jan. 4, 2013.
Office Action from U.S. Appl. No. 12/151,089, dated Oct. 5, 2012.
Response to OA from U.S. Appl. No. 12/151,089, filed Mar. 5, 2013.
Office Action from U.S. Appl. No. 13/169,866, dated Apr. 24, 2012.
Response to OA from U.S. Appl. No. 13/169,866, filed Jul. 19, 2012.
Office Action from U.S. Appl. No. 10/836,743. dated Dec. 8, 2009.
Response to Office Action from U.S. Appl. No. 10/836,743, filed Apr. 8, 2010.
Office Action from U.S. Appl. No. 12/821,069, dated Dec. 28, 2010.
Office Action from U.S. Appl. No. 11/985,410, dated Jan. 4, 2010.
Response to Office Action from U.S. Appl. No. 11/985,410, filed May 11, 2010.
Office Action from U.S. Appl. No. 10/836,743, dated Apr. 29, 2010.
Response to Office Action from U.S. Appl. No. 10/836,743, filed Aug. 30, 2010.
Office Action from U.S. Appl. No. 12/384,277, dated May 13, 2010.
Response to Office Action from U.S. Appl. No. 12/384,277, filed Sep. 2, 2010.
Office Action from U.S. Appl. No. 11/708,990, dated May 26, 2010.
Response to Office Action from U.S. Appl. No. 11/708,990, filed Nov. 18, 2010.
Office Action from U.S. Appl. No. 12/002,429, dated Jun. 9, 2010.
Response to Office Action from U.S. Appl. No. 12/002,429, filed Dec. 1, 2010.
Office Action from U.S. Appl. No. 11/985,410, dated Jul. 15, 2010.
Response to Office Action from U.S. Appl. No. 11/985,410, filed Dec. 14, 2010.
Office Action from U.S. Appl. No. 12/845,629, dated Sep. 29, 2010.
Response to Office Action from U.S. Appl. No. 12/845,629, filed Jan. 26, 2011.
Office Action from U.S. Appl. No. 12/002,429, dated Jan. 28, 2011.
Office Action from U.S. Appl. No. 10/836,743, dated Feb. 14, 2011.
Office Action from U.S. Appl. No. 11/708,990, dated Feb. 16, 2011.
Notice of Allowance from U.S. Appl. No. 11/818,818, dated Mar. 29, 2011.
Notice of Reasons for Refusal for Japanese Patent Application No. 2008-163311, dated Jun. 28, 2012, 6 pages.
Decision to Grant for Japanese Patent Application No. 2008-163311, dated Aug. 16, 2012, 5 pages.

\* cited by examiner

LIGHT EMITTING DEVICE PACKAGES USING LIGHT SCATTERING PARTICLES OF DIFFERENT SIZE

This invention was made with Government support under Contract No. USAF 05-2-5507. The Government has certain rights in this invention.

BACKGROUND OF THE INVENTION

Field of the Invention

The invention relates to light emitting devices and, more particularly, to white light emitting diodes and multi-colored light emitting diodes in single or multiple-chip packages.

Description of the Related Art

Light emitting diodes (LED or LEDs) are solid state devices that convert electric energy to light, and generally comprise one or more active layers of semiconductor material sandwiched between oppositely doped layers. Typically, wire bonds are used to apply a bias across the doped layers, injecting holes and electrons into the active layer where they recombine to generate light. Light is emitted from the active layer and from all surfaces of the LED. A typical high efficiency LED comprises an LED chip mounted to an LED package and encapsulated by a transparent medium. The efficient extraction of light from LEDs is a major concern in the fabrication of high efficiency LEDs.

LEDs can be fabricated to emit light in various colors. However, conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the energy of some of the LED's blue light which increases the wavelength of the light, changing its color to yellow. Some of the blue light passes through the phosphor without being changed while a portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

It is noted that throughout the application reference is made to two different angles of interest. The first is the viewing angle which is shown as exemplary $\theta_v$ in FIG. 1a. The viewing angle is measured from the optic axis which in this case runs through the center of the hemispherical encapsulant and is perpendicular to the flat edge of the encapsulant. A viewing angle of zero degrees (0°) indicates that the output from the encapsulant is being viewed (or measured) from a point outside the encapsulant that is directly opposite the source, i.e., on-axis. The viewing angle increases as the device is tilted with respect to the viewer. A viewing angle of ninety degrees (90°) indicates that the output is being measured from an angle that is perpendicular to the optic axis and even with the flat edge of the encapsulant, i.e., directly from the side.

Figure 1A:
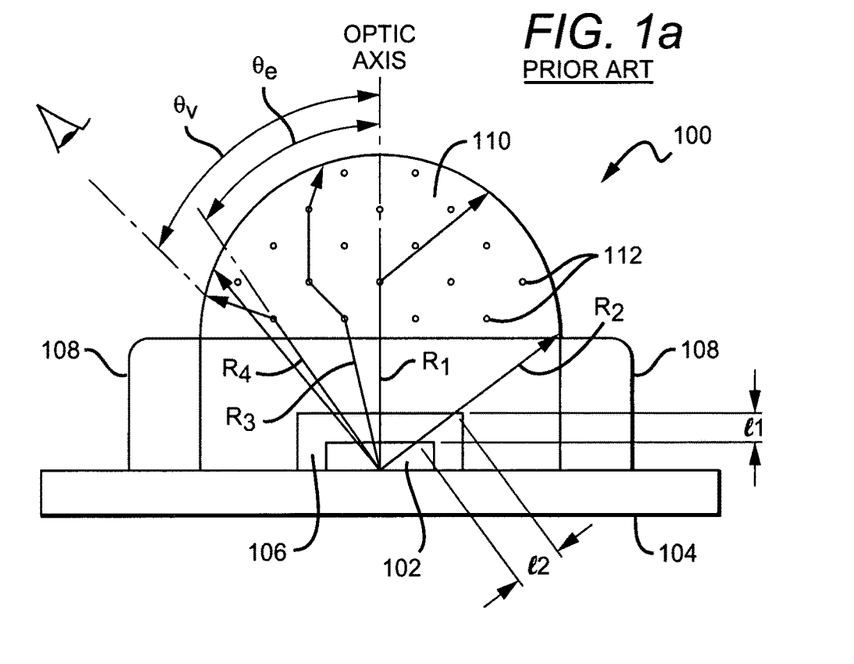
FIG. 1a is a cross sectional view of an emitting device in the prior art.

The second angle that is referenced is the emission angle which is shown as $\theta_e$ in FIG. 1a. The emission angle shares the same optic axis with the viewing angle. It measures the angle from the optic axis at which a light ray initially propagates in the encapsulant after it is emitted from the source. A light ray that initially propagates from the source along the optic axis (e.g., ray $R_1$) has an emission angle of 0°. As shown ray Ee is approximately forty degrees (40°). The emission angle increases as the direction of initial propagation deviates from the optic axis. An important difference between the two angles is that the output profile at a given viewing angle is affected by scattering events inside the encapsulant, whereas the emission angle describes the direction of the light as it is initially emitted from the source before it can interact with materials within the encapsulant.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

A common type of LED packaging where a phosphor is introduced over an LED is known as a "glob-in-a-cup" method. An LED chip resides at the bottom of a cup-like recession, and a phosphor containing material (e.g. phosphor particles distributed in an encapsulant such as silicone or epoxy) is injected into and fills the cup, surrounding and encapsulating the LED. The encapsulant material is then cured to harden it around the LED. This packaging, however, can result in an LED package having significant variation of the color temperature of emitted light at different viewing angles with respect to the package. This color variation can be caused by a number of factors, including the different path lengths that light can travel through the conversion material. This problem can be made worse in packages where the phosphor containing matrix material extends above the "rim" of the cup in which the LED resides, resulting in a predominance of converted light emitted sideways into high viewing angles (e.g., at 90 degrees from the optic axis). The result is that the white light emitted by the LED package becomes non-uniform and can have bands or patches of light having different colors or intensities.

Another method for packaging or coating LEDs comprises direct coupling of phosphor particles onto the surfaces of the LED using methods such as electrophoretic deposition. This process uses electrostatic charge to attract phosphor particles to the surface of the LED chip that is charged. This method can result in improvement of the color uniformity as a function of viewing angle with one reason for this improvement being the source of the converted light and unconverted light being at close to the same point in space. For example, a blue emitting LED covered by a yellow converting material can provide a substantially uniform white light source because the converting material and LED are close to the same point in space. This method can present inconsistencies due to difficulties in controlling electrostatic charges across many LEDs in a mass production environment.

Figure 1B:
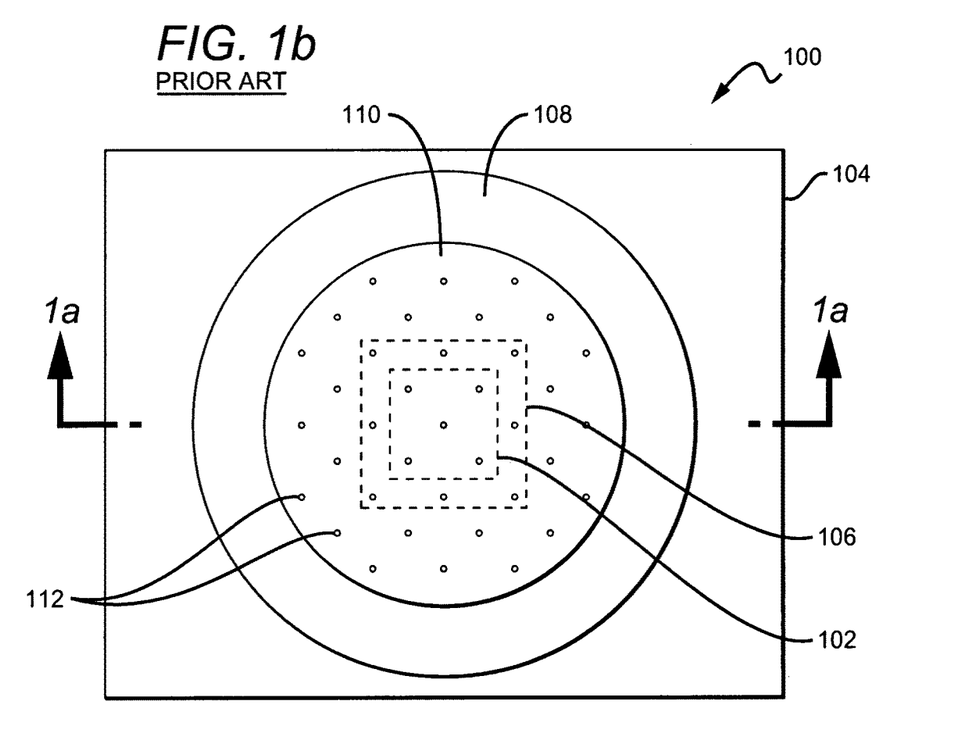

A known approach to addressing these inconsistencies to improve the spatial color temperature uniformity of the emitted light is to randomize the path of outgoing light rays using light scattering particles. FIGS. 1a and 1b illustrate a light emitting device 100 employing this approach. FIG. 1a represents a cross-section of the known device taken along section line 1a (shown in FIG. 1b). A light source 102 is disposed on a substrate 104. A layer of downconverting material 106 covers the light source 102. A reflector 108 is disposed around the light source 102 on the substrate 104 such that the light source 102 is housed in a cavity defined by the reflector 108 and the substrate 104. A hemispherical encapsulant 110 is disposed over the light source 102. The encapsulant 110 may be mounted over the light source 102 using an epoxy adhesive, for example, although other mounting methods may also be used. Light scattering particles 112 are disposed throughout the encapsulant 110.

Light rays R1-R4 model the paths of exemplary photons that are emitted from the source 102. As shown, R1 is emitted and passes through a length ($l_1$) of the downconverting material 106 where there is a probability that the light experiences a wavelength conversion. It is noted that the probability that a photon will be downconverted (i.e., absorbed and re-emitted) increases with the distance that the photon travels through the downconverting material 106. Thus, R2 which travels a greater distance ($l_2$) through the downconverting material 106 has a greater chance of being downconverted. It follows that, depending on the shape of the downconverting layer, the percentage of light that experiences a downconversion upon passing through the downconverting layer 106 is a function of the angle of emission from the source 102. Without light scattering particles, the emission spectrum would exhibit a pronounced pattern, producing a light spot with variances in color temperature and intensity often noticeable to the human eye. Such non-uniformities can render a light emitting device undesirable for certain applications.

After passing through the downconverting material 106, the light enters the encapsulant 110. The light scattering particles 112 distributed throughout the encapsulant 110 are designed to redirect the individual photons before they are emitted to randomize the point where the photons exit the encapsulant 110. This has the effect of improving spatial color temperature uniformity. For example, R1 collides with a light scattering particle, changes direction, and is emitted as shown. R1 exits the encapsulant 110 at a different point than it would have if no scattering particles were present. R3 experiences multiple scattering events. R2 and R4 pass through the encapsulant unimpeded. Thus, the light scattering particles randomize (to a certain degree) the point at which emitted photons exit the encapsulant 110 by disassociating the photons from their initial emission angle.

In order to emit light having a specific spectral content, it is known to use LED packages having multiple chips. Often, multiple chips having different colors are used in the same package. For example, a red chip, a green chip and a blue chip can be used in combination to form a white light package (solid state RGB). Other multi-chip combinations are also common, such as the solid state RGGB which comprises one red chip, one blue chip and two green chips per unit. Phosphor conversion layers may be used in conjunction with these multi-chip devices, for example, the phosphor converted RGB which is used for high Color Rendering Index applications. Another known device consists of a phosphor converted white LED and a solid state red chip. Other combinations of phosphor converted colored chips and solid state chips are also known in a multi-chip LED package.

SUMMARY OF THE INVENTION

An embodiment of an emitting device comprises at least one emitter that emits a spectrum of radiation. A first plurality of scattering particles of a first size at least partially surrounds the at least one emitter, and a second plurality of scattering particles of a second size at least partially surrounds the at least one emitter. Respective portions of the radiation emitted from the emitter interact with the first and second pluralities of scattering particles.

An embodiment of a light emitting device comprises at least one light emitter. An encapsulant is arranged such that substantially all of the light emitted from the light emitter passes through the encapsulant. A plurality of scattering particles is disposed throughout the encapsulant. This plurality of scattering particles comprises at least two different sizes of particles.

An embodiment of an encapsulant comprises a first material defining the shape of the encapsulant, the first material having a first refractive index. A second material having a particulate characteristic is dispersed within the first material, the second material having a second refractive index. A third material having a particulate characteristic is dispersed within the first material, the third material having a third refractive index.

Another embodiment of an encapsulant comprises a first material defining the shape of the encapsulant. A second material having a particulate characteristic is dispersed within the first material, the second material comprising particles of an average size. A third material having a particulate characteristic is dispersed within the first material, the third material comprising particles of an average size different than that of the particles in the second material.

BRIEF DESCRIPTION OF THE DRAWINGS

FIG. 1b is a top plan view of the known emitting device of FIG. 1a.

DETAILED DESCRIPTION OF THE INVENTION

Embodiments of the present invention provide an improved radiation emitting device and, more specifically, a light emitting device exhibiting excellent color uniformity and improved spatial color mixing in multi-colored packages. The embodiments are particularly well-suited for use with white light emitting diodes (LEDs) and various multi-colored LED packages with single- or multi-chip applications. Similarly as in other LED devices, a bias voltage is applied across the device and light is emitted as a result of radiative recombination in the active region of the device. It is often desirable to engineer the output of an LED, sometimes referred to as the light spot. Some applications require a light spot with a high degree of color temperature uniformity and, in the case of multi-colored packages, good spatial color mixing. Devices may also be designed to output a light spot with a customized pattern. Although most of the devices discussed herein are designed to emit radiation in the visible spectrum, some devices may emit radiation in the infrared, ultraviolet, or other ranges. The term "light" is used for convenience and should not be construed to exclude emission in ranges or sub-ranges outside the visible spectrum unless explicitly stated otherwise.

One embodiment improves the color temperature uniformity and spatial color mixing using light scattering particles (LSPs) of different sizes and/or different indices of refraction. Typically, both particle size and index of refraction vary with different materials. The LSPs at least partially surround the emitter(s) to scatter substantially all of the emitted light. The LSPs may be disposed in several places as discussed in detail below.

The way that particles interact with light in a given wavelength range is a product of both the particle size and the refractive quality of the material (indicated by the index of refraction). By using differently sized particles, more than one sub-range of light can be scattered which is particularly useful with devices that emit over more than one well-defined wavelength range. The LSPs function to randomize the emitted light by causing it to deviate from the path along which it was initially emitted from the source, providing improved color temperature uniformity and color-mixing over the entire range of viewing angles. Similarly, LSPs can be arranged to intentionally create a non-uniform color temperature profile for specialized applications. In this context, there are generally three ways that LSPs scatter the light: reflection, refraction and diffraction.

Reflection is the change in direction of light at an interface between media having different indices of refraction so that the light returns into the medium from which it originated. As light traveling in a medium reaches an interface with another material having a different index of refraction, the light is deflected back into the medium. In the case of LSPs, the light can be deflected back in the direction it came from or at an angle to the side, depending on where the light hits the particle. For purposes of scattering light that will eventually be emitted, sideways scattering is preferred so that the amount of light reflected backwards (backscattering) towards absorbent materials is reduced.

Light may also be scattered by refraction. Refraction is the change in direction of light due to a change in phase velocity (i.e., the speed a wave propagates in a medium). In this context, refraction takes place when light travels from one medium to another medium having a different index of refraction. In one embodiment, light is emitted into an encapsulant medium where it interacts with LSPs distributed throughout the medium. As the light enters the LSPs, it changes speed, resulting in a change of direction, scattering.

Light can also be scattered by diffraction. Diffraction is the bending of light around an object or an aperture due to the wave-like characteristics of light. As light passes close by an object, for example an LSP, the light bends around the object, deviating from its original path as it was approaching the object. With large objects the bending effect is barely noticeable. However, as the size of the object approaches the wavelength of the incident light, the phenomenon becomes significant. In this context, when the size of the LSPs approaches one half the wavelength of the incident light, the light can bend approximately five times as much light as actually strikes the object. Thus, with an appropriately sized LSP, the diffraction area around the particle can be increased to approximately five times the diameter of the particle. To take advantage of the increased diffraction cross-section, the size of the LSP must be carefully chosen for light having a particular wavelength range or sub-range.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer, section or characteristic from another. Thus, a first element, component, region, layer, section or characteristic discussed below could be termed a second element, component, region, layer, section or characteristic without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote an homogeneous layer of material. A single "layer" may contain various scattering material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or particles illustrated herein but are to include deviations in shapes that result, for example, from manufacturing. A region illustrated or described as rectangular, for example, will typically have rounded or curved features due to normal manufacturing tolerances. Thus, the regions illustrated in the figures are schematic in nature and their shapes are not intended to illustrate the precise shape of a region or particle and are not intended to limit the scope of the invention.

Figure 2:
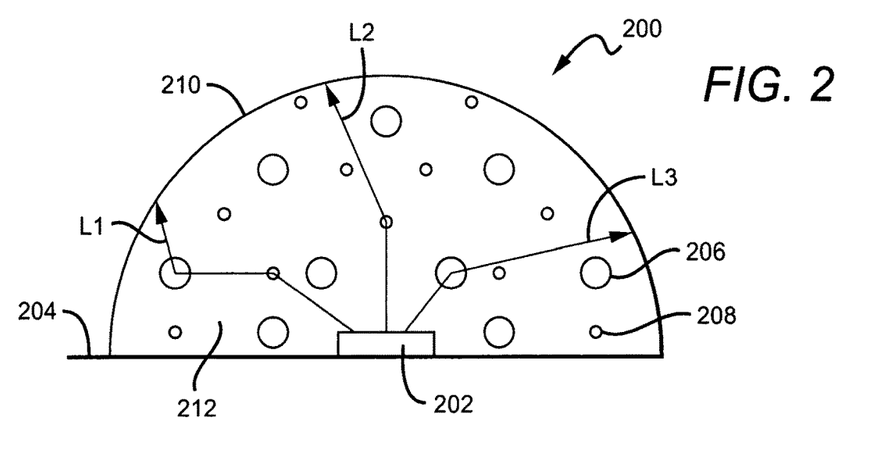
FIG. 2 is a cross sectional view of an emitting device according to an embodiment of the present invention.

FIG. 2 shows an embodiment of an emitting device 200 according to the present invention. Emitter 202 is disposed on a surface 204, for example a substrate or a printed circuit board. The emitter 202 can be an LED, a vertical cavity surface-emitting laser (VCSEL), or another type of emitting device. The emitter 202 emits a spectrum of light which can comprise a single range or multiple sub-ranges of wavelengths. In this particular embodiment, LSPs 206, 208 of a first and second size are dispersed throughout an encapsulant 210 and at least partially surround the emitter 202. The LSPs can also be disposed in other media around the emitter as discussed in detail below.

The emitter 202 emits a spectrum of light. Light rays L1-L3 model how some of the light might will interact with the LSPs 206, 208. A first portion of the spectrum will be affected most by the first size of particles 206 as shown by light ray L3. A second portion of the spectrum will be affected most by the second size of particles 208 as shown by light ray L2. Some of the emitted light will be affected by both sizes of particles 206, 208 as shown by light ray L1. The LSP materials should be selected according to the characteristics of the spectrum from emitter 202 and the desired output from the device 200.

In this embodiment, the encapsulant 210 comprises at least three different materials. A medium 212 gives the encapsulant 210 shape. A preferred shape for the encapsulant 210 is a hemisphere having a curved surface and a flat surface. However, many other encapsulant shapes can also be used such as a flat shape or planoconvex, for example. The medium 212 comprises thermally or optically curable materials, such as transparent epoxy, silicone, glass, plastic or any other transparent medium. The LSPs 206, 208 are distributed throughout the medium 212.

Scattering particles 206, 208 can comprise many different materials, including:
  silica gel;
  zinc oxide (ZnO);
  yttrium oxide ($Y_2O_3$);
  titanium dioxide ($TiO_2$);
  barium sulfate ($BaSO_4$);
  alumina ($Al_2O_3$);
  fused silica ($SiO_2$);
  fumed silica ($SiO_2$);
  aluminum nitride;
  glass beads;
  zirconium dioxide ($ZrO_2$);
  silicon carbide (SiC);
  tantalum oxide ($TaO_5$);
  silicon nitride ($Si_3N_4$);
  niobium oxide ($Nb_2O_5$);
  boron nitride (BN); or
  phosphor particles (e.g., YAG:Ce, BOSE)
Other materials not listed may also be used. Various combinations of materials or combinations of different forms of the same material may be used to achieve a particular scattering effect. For example, in one embodiment a first plurality of LSPs may comprise alumina and a second plurality of LSPs may comprise titanium dioxide. In another exemplary embodiment, the first plurality of LSPs may comprise rutile titanium dioxide while the second plurality of LSPs comprises anatase titanium dioxide. Although the emitting device 200 only features two different sizes of LSPs, many more sizes can be used to achieve a desired output.

These LSPs 206, 208 should have a high index of refraction relative to the surrounding medium 212, creating a large index of refraction differential between the materials. Because the index differential causes refraction, it would also be possible to use an LSP material that has a low index of refraction relative to the surrounding medium 212. The LSPs 206, 208 create localized non-uniformities in the medium 212 that force the light to deviate from a straight path.

When the light strikes one or more of the scattering particles 206, 208 the index of refraction differential between the medium 212 and the particles 206, 208 causes the light to refract and travel in a different direction. A large index of refraction differential yields a more drastic direction change for an incident photon. For this reason, materials with a high index of refraction work well in mediums such as silicone or epoxy. Another consideration when choosing a light scattering material is the optical absorbance of the material. Large particles backscatter more of the light inside the package before it can escape the encapsulant 200, decreasing the total luminous output of the device. Thus, preferred scattering particle materials have a high index of refraction relative to the medium and a particle size comparable to the wavelength of the light propagating through the encapsulant 210. An ideal combination of LSPs ensures maximum forward or sideways scattering effect for a given spectrum while minimizing light loss due to backscattering and absorption.

Various percentages of composition of the LSPs 206, 208 can be used as dictated by the application. Depending on the materials used, the LSPs 206, 208 will typically be found in concentrations ranging from 0.01% to 0.2% by volume. Other concentrations can be used; however, the loss due to absorption increases with the concentration of the scattering particles. Thus, the concentrations of the LSPs should be chosen in order to maintain an acceptable loss figure.

Figure 3:
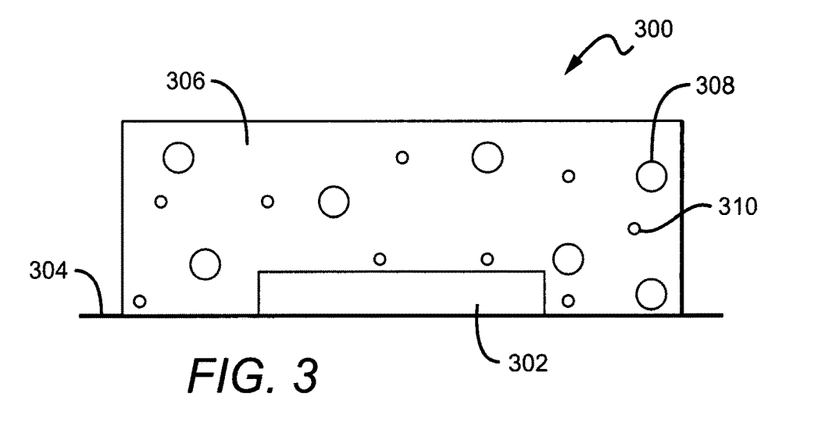
FIG. 3 is a cross sectional view of an emitting device according to an embodiment of the present invention.

FIG. 3 illustrates another embodiment of a light emitting device 300 according to the present invention. An emitter 302 is disposed on a surface 304. Also disposed on the surface 304 and partially surrounding the emitter 302 is a layer of wavelength conversion material 306, such as a phosphor layer, for example. This conversion layer 306 interacts with light emitted by the emitter 302, downconverting a portion of it to create an output spectrum different from that of the emitter 302. There are many downconversion processes that are known in the art. In this embodiment, two different sizes of LSPs 208, 210 are dispersed throughout the wavelength conversion layer 306. Although not shown in this figure, the device 300 may also be partially surrounded by an encapsulant or a lens element. These elements may or may not include additional LSPs embedded within them.

The device 300 shown in FIG. 3 emits two discrete spectra. The first spectrum is emitted directly from the emitter 302. A second spectrum is emitted from the device 300 as a result of the downconversion process. One known emitter configuration uses an emitter that emits light in the blue range. As the blue light propagates through the conversion material, a portion of it is downconverted to yellow light. The two sub-spectra combine, resulting a in a white light emission. In this particular embodiment, there are two different sizes of LSPs corresponding to the blue and the yellow sub-spectra. The LSPs can be chosen to yield a significant scattering effect over both wavelength ranges to yield better spatial color-mixing over the entire output profile.

Figure 4:
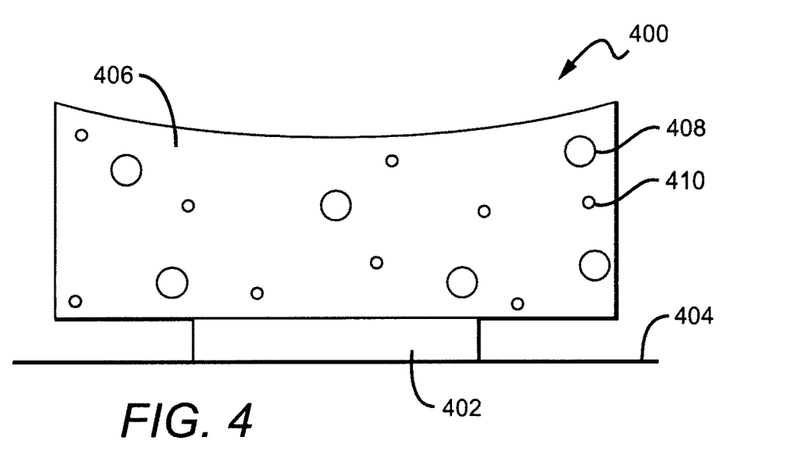
FIG. 4 is a cross sectional view of an emitting device according to an embodiment of the present invention.

FIG. 4 shows another embodiment of an emitting device 400 according to the present invention. An emitter 402 is disposed on a surface 404. A lens element 406 is positioned above the emitter 402 so that a portion of the light from the emitter 402 interacts with the lens element 406 and is shaped or otherwise altered. For example, the light may be shaped into a collimated beam or focused to a particular point outside the device 400. In this embodiment, the lens element comprises a plano-concave structure. This configuration is only exemplary as the light beam can be altered in many ways using many different structures and materials as lens elements.

In device 400, there are two different sizes of LSPs 408, 410 which are dispersed throughout the lens element 406. Similarly as discussed above, the LSPs 408, 410 interact with different sub-spectra of emitter 402 to scatter the light and improve the uniformity of the output color over the entire range of viewing angles.

Figure 5:
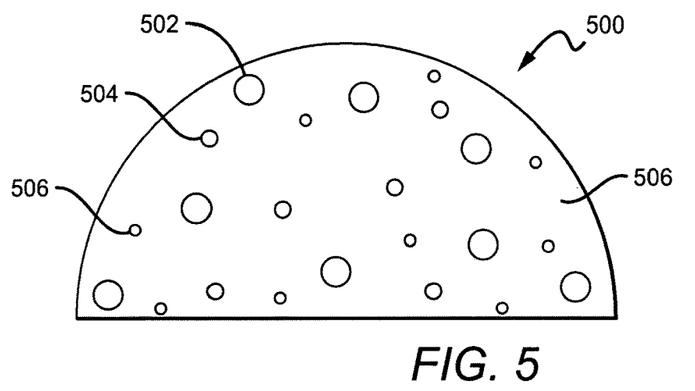
FIG. 5 is a cross sectional view on an encapsulant according to an embodiment of the present invention.

FIG. 5 illustrates an embodiment of an encapsulant 500 according to the present invention. The encapsulant 500 can be used in conjunction with an emitter similar to the device 200 in FIG. 2. Three different sizes of LSPs 502, 504, 506 are scattered throughout the encapsulant medium 508. The encapsulant 500 can be used with single- or multiple-emitter packages to scatter light over at least three different sub-spectra, providing for better spatial color-mixing. Additional LSPs of different sizes can be added for scattering over additional wavelength ranges.

Figure 6:
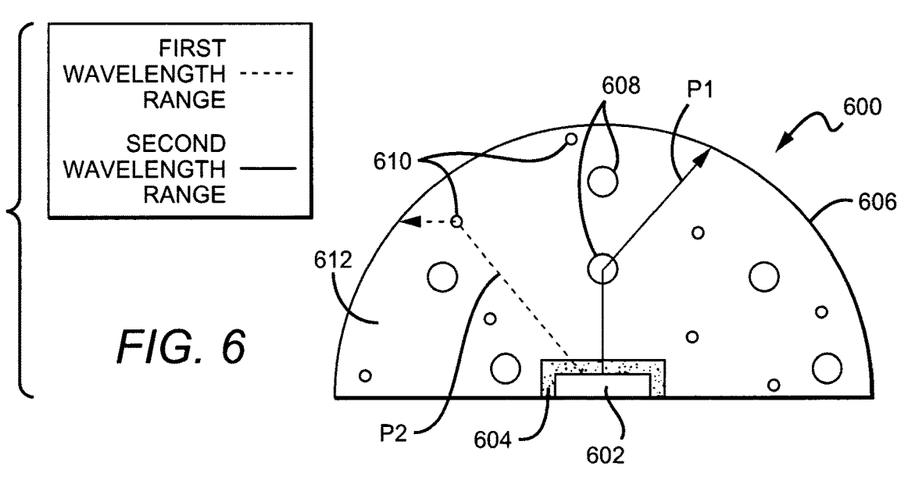
FIG. 6 is a cross sectional view of an emitting device according to an embodiment of the present invention.

FIG. 6 shows an embodiment of an emitting device 600 according to the present invention. An emitter 602 is at least partially covered by a wavelength conversion layer 604, such as a phosphor layer. Light having a first wavelength range is emitted from the emitter 602 and passes through the conversion layer 604, a portion of which is converted to light having a second wavelength range.

Two light rays P1, P2 are shown to model two exemplary paths that light could travel in the device 600. Light ray P1 has a wavelength within the first range, and the wavelength of P2 lies in the second range. Light ray P1 is emitted from the emitter 602 and passes through the conversion layer 604 without being converted. The light ray P1 then travels into the encapsulant 606 where it has a probability of interacting with LSPs 608, 610 scattered throughout the encapsulant medium 612. The light ray P1 interacts with an LSP 608 and deviates from its initial path. The light ray P2 is emitted and is downconverted in the conversion layer 604. The ray P2 then enters the encapsulant 606 where it interacts with an LSP 610 and is deflected from its initial path. The inclusion of two different sizes of LSPs 608, 610 increases the randomization of the paths of light from both wavelength sub-ranges.

Figure 7:
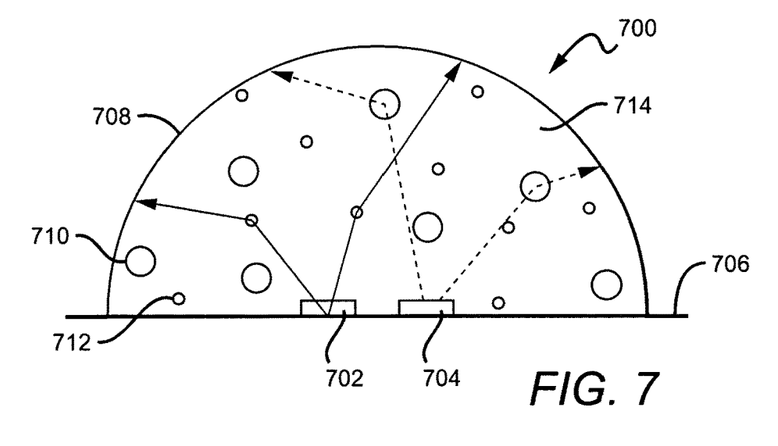
FIG. 7 is a cross sectional view of an emitting device according to an embodiment of the present invention.

FIG. 7 illustrates an embodiment of an emitting device 700 according to the present invention. The device 700 comprises multiple emitters 702, 704, both of which are disposed on a common surface 706. The emitters 702, 704 can be the same color or different colors. One possible arrangement includes a green emitter and a blue emitter. The wavelength ranges of these emitters can be combined to give off a white light if good color-mixing is achieved. Another arrangement might include a red emitter and a white emitter. Such a combination can be used to emit "warm" white light which has a slight reddish or orange tint. Other combinations such as a red-green-blue package (RGB) or a red-green-green-blue (RGGB) package can be used. Various other colored emitter combinations are possible. In some applications, it is desirable to select a color combination that may be used to create a device with an excellent color rendering index ("CRI"). Light sources with an excellent CRI are useful for lighting scenes in which the detail of the colors in the scene is significant.

An encapsulant 708 is arranged over and at least partially surrounding the emitters 702, 704. Multiple sizes of LSPs 710, 712 are dispersed throughout an encapsulant medium 714. In multi-colored embodiments, because the emitters 702, 704 are disposed at different positions, off-center, with respect to the encapsulant 708, it is important to efficiently scatter the light emitted from both sources so that no color patterns appear in the light spot. Due to the geometry of most encapsulants or lens elements, an emitter that is placed off-center will require more scattering to achieve good spatial color-mixing. In this embodiment, the emitters 702, 704 emit two different colors of light. The light rays emanating from the emitter 702 interact more efficiently with the smaller sized LSPs 712; whereas the rays from 704 are scattered more significantly with the larger LSPs 710 as shown. The LSPs 710, 712 may be dispersed homogeneously throughout the medium 714 as shown in FIG. 7, or they may be dispersed inhomogeneously throughout the medium 714 as discussed below with reference to FIG. 9.

Figure 8:
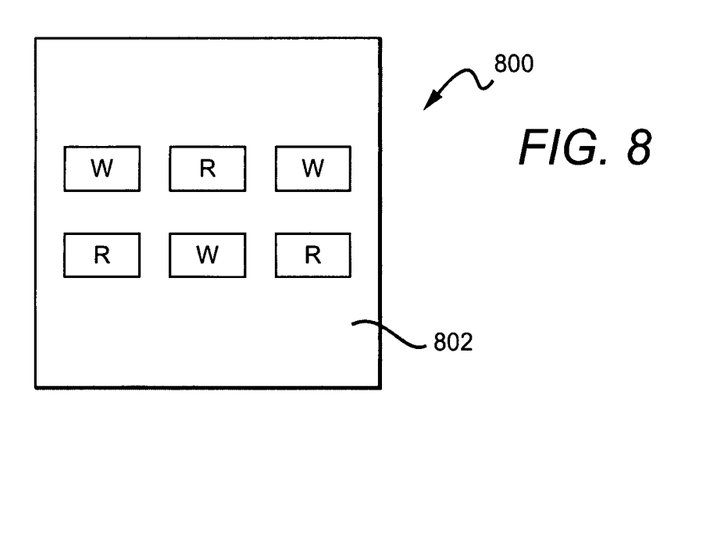
FIG. 8 is a top plan view of a multiple-chip emitter package.

FIG. 8 shows an embodiment of an emitter chip package 800, comprising three white emitters (W) and three red emitters (R) arranged in a pattern on a surface 802. Although each of the emitters may emit omnidirectionally away from the surface 802, the position of the emitters would create a noticeable color pattern in the output light spot in the absence of a randomization mechanism, such as a scatterer. In order to compensate for the resulting uneven distribution of color in the output, LSPs (not shown) can be in inhomogeneously dispersed in a medium at least partially surrounding the emitters. LSPs of a certain size can be concentrated in areas where light having a particular wavelength is more likely to be propagating.

Figure 9:
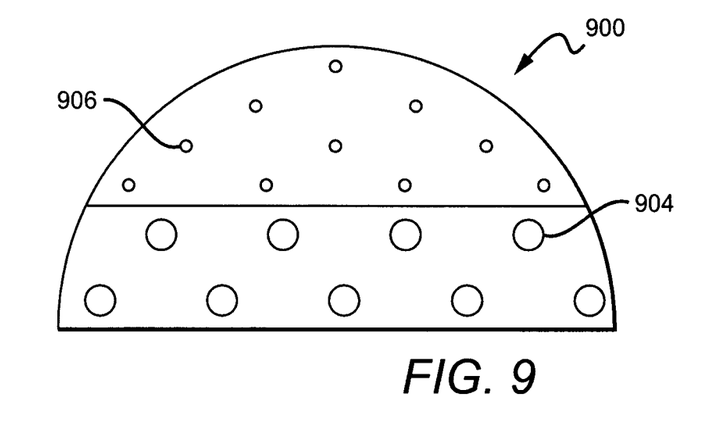
FIG. 9 is a cross sectional view of an encapsulant according to an embodiment of the present invention.

FIG. 9 is an embodiment of an encapsulant 900 according to the present invention. The encapsulant 900 can be used with a single- or multiple-emitter package. In some configurations, it may be advantageous to cluster LSPs of a particular size in an area to increase scattering of a color of light which is concentrated in that area, perhaps due to the location of a corresponding emitter. An inhomogeneous mixture may comprise several different sizes of LSPs which are not uniformly distributed throughout the medium. The inhomogeneous mixture of the differently sized LSPs 902, 904 can be used to correct for specific color patterns in the output light spot. The configuration shown in the encapsulant 900 is merely exemplary, showing one possible inhomogeneous mixture of LSPs; it does not necessarily correspond to any particular emitter arrangement. Some embodiments of inhomogeneous mixtures can function to improve spatial color mixing; others can function to create a customized output pattern in the light spot.

Figure 10:
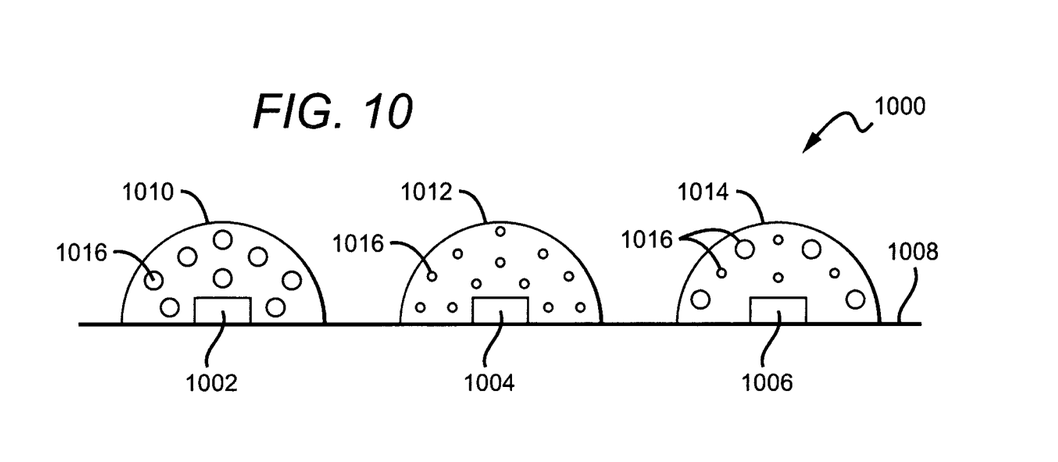
FIG. 10 is a cross sectional view of a multi-chip emitter package according to an embodiment of the present invention.

FIG. 10 illustrates an embodiment of a multi-chip polychromatic emitter package 1000 according to the present invention. Multiple emitter chips 1002, 1004, 1006 are disposed on a common surface 1008, such as a substrate or a PCB. The package 1000 comprises chips having at least two different colors. For example, in FIG. 10 each chip emits a different spectrum. The chips 1002, 1004, 1006 are separately encapsulated, as shown. Each of the encapsulants 1010, 1012, 1014 comprises LSPs 1016 that are dispersed throughout the encapsulant medium. LSPs 1016 of different sizes are used to effectively scatter the distinct spectrum emitted by each chip.

The LSPs 1016 in each encapsulant are selected based on their properties to achieve efficient scattering for the chip they surround. For example, emitter 1002 is surrounded by encapsulant 1010 which has relatively large LSPs 1016. The encapsulant 1012 surrounding emitter 1004 comprises relatively small LSPs 1016. The emitter 1006 corresponds with the encapsulant 1014 which features two different sizes of LSPs 1016. The configuration shown in FIG. 10 is merely exemplary. Many different combinations are possible.

By grouping the LSPs 1016 separately around the different emitters 1002, 1004, 1006 the individual emitter spectrums can be tailored. These sub-spectrums can then be combined to emit a highly tailored spectrum with good spatial color mixing. The differently sized LSPs 1016 can also be grouped around the emitters within structures other than encapsulants. As discussed above the LSPs can be dispersed throughout a conversion layer or a lens element, for examples.

Figure 11:
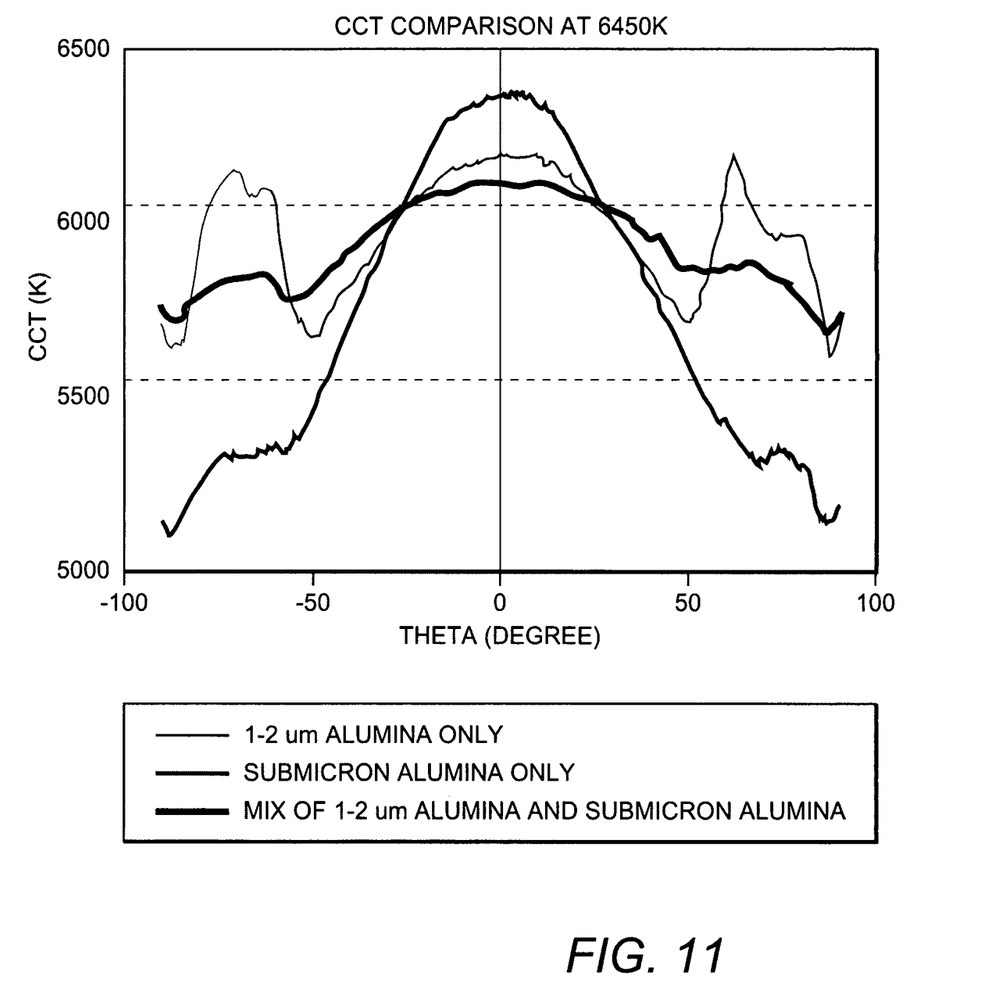
FIG. 11 is a graph showing the experimental results of various light scattering particle combinations used with a white chip LED.

FIG. 11 is a graph of the experimental results of three different selections of LSPs for the same nominal color of light. The source in this case emits light having a correlated color temperature of 6450 K (i.e., in the cool white range). The graph shows the correlated color temperature (CCT) in Kelvin as a function of the viewing angle, Theta, in degrees, from −90° to 90°.

One selection of LSPs comprises alumina particles (0.1% by volume) having diameters in the submicron range. The CCT ranges from approximately 5100 K to 6400 K with the higher CCTs appearing near the central axis of the encapsulant (i.e., at 0°). Thus, the output CCT is distributed over about 1300 K.

Another selection of LSPs comprises alumina particles (0.075% by volume) having diameters in the 1-2 μm range. The output ranges from about 5600 K to 6200 K for a differential range of around 600 K. Two large humps appear at higher viewing angles, indicating a bluer tint to the light emitted at the higher viewing angles relative to that emitted in the mid-range angles. Although the 600 K CCT range is relatively good, the distribution over the entire range of viewing angles is not smooth.

Another selection of LSPs comprises a mixture of two different sizes of particles. The combination includes both submicron alumina particles (0.14% by volume) and alumina particles in the 1-2 μm range (0.08% by volume). The output CCT ranges from about 5700 K to 6100 K for a differential range of approximately 400 K. It is also noted that the distribution of the CCT is relatively smooth over the entire range of viewing angles with only small humps at the higher angles. Thus, using LSPs of more than one size, a more uniform color temperature distribution is achieved, indicating good color mixing within the encapsulant.

Although the present invention has been described in detail with reference to certain preferred configurations thereof, other versions are possible. Therefore, the spirit and scope of the invention should not be limited to the versions described above.

I claim:

1. An emitting device, comprising:
multiple emitters spaced apart on a common flat surface, wherein each of said multiple emitters emit a spectrum of radiation and at least two of said emitters emit spectrums having different wavelength ranges;
an encapsulant over said multiple emitters and on said common flat surface, each of said emitters disposed off-center on said common flat surface with respect to said encapsulant;
a first plurality of scattering particles comprising a diameter greater than 1 micrometer at least partially surrounding at least one emitter of said multiple emitters, wherein said first plurality of scattering particles scatters light at wavelengths within a first sub-spectrum of said spectrums; and
a second plurality of scattering particles comprising a diameter less than 1 micrometer at least partially surrounding at least one emitter of said multiple emitters, wherein said second plurality of scattering particles scatters light at wavelengths within a second sub-spectrum of said spectrums;
wherein said first plurality of scattering particles interacts with said wavelengths within said first sub-spectrum more than said wavelengths within said second sub-spectrum, and said second plurality of scattering particles interacts with said wavelengths within said second sub-spectrum more than said wavelengths within said first sub-spectrum;
wherein said first and second pluralities of scattering particles are mixed together in and are dispersed throughout a common medium and said first and second pluralities of scattering particles contain indices of refraction different than the index of refraction of said common medium;
wherein radiation emitted from said multiple emitters interacts with said first and second pluralities of scattering particles, such that said diameters of said first and second pluralities of scattering particles and the index of refraction differential between said common medium and said first and second pluralities of scattering particles create a substantially forward or sideways scattering effect over said first sub-spectrum and said second sub-spectrum.

2. The emitting device of claim 1, wherein said emitted spectrum comprises visible light.

3. The emitting device of claim 1, further comprising additional pluralities of scattering particles such that said emitting device comprises scattering particles of at least three different sizes.

4. The emitting device of claim 1, wherein said first and second pluralities of light scattering particles in said encapsulant are configured such that said emitted radiation passes through said encapsulant.

5. The emitting device of claim 1, wherein said first and second pluralities of light scattering particles are positioned in a wavelength conversion layer that at least partially surrounds said at least one emitter.

6. The emitting device of claim 1, wherein said first and second pluralities of light scattering particles are positioned in a lens element that interacts with said emitted radiation.

7. The emitting device of claim 1, wherein said first plurality of light scattering particles comprises alumina ($Al_2O_3$).

8. The emitting device of claim 1, wherein said first and second pluralities of light scattering particles are homogeneously mixed.

9. The emitting device of claim 1, wherein said first plurality of scattering particles at least partially surrounds said emitter according to a first particle density.

10. The emitting device of claim 1, wherein said second plurality of scattering particles at least partially surrounds said emitter according to a second particle density.

11. The emitting device of claim 1, wherein the density of said first plurality of particles and the density of said second plurality of particles are related according to a density ratio.

12. The emitting device of claim 1, wherein said first plurality of scattering particles comprises alumina particles, said alumina particles comprising diameters ranging from approximately 1-2 micrometers and distributed at approximately 0.08% per volume in a medium surrounding said at least one emitter.

13. The emitting device of claim 12, wherein said second plurality of scattering particles comprises submicron alumina particles, said submicron alumina particles comprising diameters less than approximately 1 micrometer and distributed at approximately 0.14% per volume in said medium.

14. The emitting device of claim 1, wherein the scattering particles are concentrated in the common space based on a loss figure due to absorption.

15. The emitting device of claim 1, wherein said first plurality of scattering particles and said second plurality of scattering particles comprise at least one material that is selected according to characteristics of said spectrum of radiation from said at least one emitter.

16. The emitting device of claim 1, wherein said first plurality of scattering particles and said second plurality of scattering particles comprise various combinations of materials that are used to achieve a particular scattering effect.

17. The emitting device of claim 1, wherein said first plurality of scattering particles and said second plurality of scattering particles comprise various combinations of different forms of a same material that are used to achieve a particular scattering effect.

18. A light emitting device package, comprising:
multiple emitter chips within said package, each of which is on a common surface and surrounded by a respective separate encapsulant, each of said separate encapsulants surrounding a single emitter chip, wherein each of said multiple emitter chips emits a different spectrum; said encapsulants configured such that light emitted from said multiple emitter chips passes through said encapsulants; and a plurality of scattering particles dispersed throughout each of said encapsulants, wherein said plurality of scattering particles in each encapsulant is selected to scatter the spectrum emitted by said single emitter chip surrounded by that particular encapsulant, wherein at least two of said encapsulants comprise scattering particles having different characteristics.

19. The light emitting device package of claim 18, wherein said multiple emitter chips emit at least two different colors.

20. The light emitting device package of claim 18, wherein said plurality of scattering particles in at least one of said encapsulants are homogeneously mixed within said encapsulants.

21. The light emitting device package of claim 18, wherein said multiple emitter chips comprise at least one red light emitter and at least one white light emitter.

22. The light emitting device package of claim 18, wherein said encapsulants comprise beam-shaping properties.

23. The light emitting device package of claim 18, wherein said plurality of scattering particles comprises alumina ($Al_2O_3$).

24. The light emitting device package of claim 18, wherein said plurality of scattering particles are positioned in said encapsulants according to respective particle densities, each size of scattering particle corresponding to a respective particle density.

25. The light emitting device package of claim 18, wherein said plurality of scattering particles in at least one of said multiple emitter chips comprises a first and a second size of alumina particles, said first size comprising diameters ranging from approximately 1-2 micrometers and distributed at approximately 0.08% per volume in said encapsulants, and said second size comprising diameters less than approximately 1 micrometer and distributed at approximately 0.14% per volume in said encapsulants.

26. The light emitting device package of claim 18, wherein the scattering particles are concentrated in said encapsulants based on a loss figure due to absorption.

27. The light emitting device package of claim 18, wherein said plurality of scattering particles comprise various combinations of materials that are used to achieve a particular scattering effect.

28. The light emitting device package of claim 18, wherein said plurality of scattering particles comprise various combinations of different forms of a same material that are used to achieve a particular scattering effect.

29. The light emitting device package of claim 18, further comprising a wavelength conversion layer.

* * * * *